(12) United States Patent  
Horiuchi et al.

(10) Patent No.: US 7,656,013 B2  
(45) Date of Patent: Feb. 2, 2010

(54) MULTILAYER WIRING SUBSTRATE, METHOD OF MANUFACTURING THE SAME, AND SEMICONDUCTOR DEVICE

(75) Inventors: Michio Horiuchi, Nagano (JP); Fumimasa Katagiri, Nagano (JP); Shigeaki Suganuma, Nagano (JP); Yasue Tokutake, Nagano (JP); Jun Yoshiike, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/205,057

(22) Filed: Sep. 5, 2008

(65) Prior Publication Data

US 2009/0072370 A1 Mar. 19, 2009

(30) Foreign Application Priority Data

Sep. 6, 2007 (JP) ............................. 2007-231692

(51) Int. Cl. *H01L 23/495* (2006.01)
(52) U.S. Cl. ............... 257/678; 257/687; 257/E23.085
(58) Field of Classification Search ............... 257/676, 257/678, 687, E23.011, E23.085, E23.141, 257/E23.062; 174/260, 261; 228/159
See application file for complete search history.

(56) References Cited

U.S. PATENT DOCUMENTS 7,080,446 B2 * 7/2006 Baba et al. ............... 29/832

FOREIGN PATENT DOCUMENTS

| JP | 08-078581 | 3/1996 |
| JP | 09-331133 | 12/1997 |
| JP | 09-331134 | 12/1997 |
| JP | 10-041435 | 2/1998 |
| JP | 2000-323516 | 11/2000 |

* cited by examiner

*Primary Examiner*—Roy K Potter  
(74) *Attorney, Agent, or Firm*—Drinker Biddle & Reath LLP

(57) ABSTRACT

There is provided a multilayer wiring substrate on which at least one semiconductor element is mounted. The multilayer wiring substrate includes: a baseboard; a first wiring layer formed on the baseboard and having a plurality of first wiring portions; an insulating layer formed on the baseboard; a second wiring layer formed on the insulating layer and having a plurality of second wiring portions, the second wiring portions being electrically connected to each other via a conductor wire, the conductor wire being arranged within the insulating layer three-dimensionally in a curved manner; and conductor portions configured to pass through the insulating layer and connecting the first wiring portions and the second wiring portions.

7 Claims, 10 Drawing Sheets

MULTILAYER WIRING SUBSTRATE, METHOD OF MANUFACTURING THE SAME, AND SEMICONDUCTOR DEVICE

This application is based on and claims priority from Japanese Patent Application No. 2007-231692, filed on Sep. 6, 2007, the entire contents of which are hereby incorporated by reference.

BACKGROUND OF THE INVENTION

1. Technical Field

The present disclosure relates to a multilayer wiring substrate and, more particularly, to a multilayer wiring substrate capable of exhibiting excellent electrical characteristics typified by low impedance, good impedance matching, low crosstalk, etc. and solving the problem of heat radiation, and a method of manufacturing the same. Also, the present disclosure relates to a semiconductor device using the multilayer wiring substrate.

2. Related Art

With the progress of miniaturization and higher functionality of the semiconductor device in recent years, the number of electrode terminals of the semiconductor element mounted on the semiconductor device (referred to as the "semiconductor chip" hereinafter) is increasing. In order to address this tendency, such a method has been employed in which electrode terminals are formed on an electrode terminal forming surface of the semiconductor chip in an area array fashion and then the semiconductor chip is mounted on a wiring substrate by a flip-chip bonding. According to the flip-chip bonding, the electrode terminals and external connection terminals are electrically connected by bonding bumps formed on the electrode terminals of the semiconductor element to the external connection terminals (bumps) of the wiring substrate. Also, in order to address the miniaturization of wiring patterns, a method of building up wiring substrates in plural layers, i.e., so-called "built-up method", is employed.

The wiring substrate having the above configuration has already been known. For example, in JP-A-2000-323516 (see e.g., Claims, FIG. 5), there is disclosed such a wiring substrate that includes an insulating resin formed like a sheet, electrodes formed in predetermined positions on the insulating resin, coated wires which are constructed by coating an insulating material on a surface of a conductive wire respectively to electrically connect the electrodes mutually and a part of which is exposed from the insulating resin respectively, and a conductive resin formed on the insulating resin to seal the coated wires exposed from the insulating material. Concretely, a semiconductor device having such wiring substrate can have a configuration shown in FIG. 10, for example. A semiconductor device 100 has a wiring substrate 110, a semiconductor element 112 mounted on this substrate, and solder balls 114. The wiring substrate 110 is constructed by bump bonding pads 116, external connection pads 117, a conductive resin 122, and an insulating resin 120. Also, the semiconductor element 112 has a plurality of bumps 115. The semiconductor element 112 is connected to the bump bonding pads 116 of the wiring substrate 110 by the flip-chip technology, and an underfill material 119 is filled between the semiconductor element 112 and the wiring substrate 110 to suppress occurrence of stress during the connecting step. Also, coated wires 118 are wire-bonded to both the bump bonding pads 116 and the external connection pads 117. The solder balls 114 are provided to mount a board 130 thereon.

In the semiconductor device 100 constructed as above, the problem exists in handling a heat generated from the semiconductor element 112. That is, since the board 130 is mounted just over the semiconductor element 112, the generated heat must be radiated effectively to operate the semiconductor element 112 stably. For this purpose, although not illustrated herein, normally radiation fins made of aluminum, for example, are mounted onto the back side of the wiring substrate 110 shown in FIG. 10 (the surface on the opposite side to the mounting surface of the semiconductor element 112), and thus the heat can be radiated from the radiation fins to the outside. However, when the wiring substrate is formed of the multilayer wiring substrate, such multilayer wiring substrate is constructed such that an electronic component is also mounted on the backside of the multilayer wiring substrate via the solder bumps, and thus the radiation fins cannot be mounted. Therefore, it is desirable that the problem of heat radiation should be solved in the multilayer wiring substrate.

In the multilayer wiring substrate, such a configuration is employed that inside pad portions that are not rerouted by the uppermost wiring layer in the pad array used for the high-density mutual connection are connected to the underlying wiring layer via the vertical vias whereas pad portions that are not rerouted by the wiring layer are connected to the further underlying wiring layer via the vertical vias. When such configuration is employed, the pad portions that are not rerouted by the uppermost layer are connected to the underlying layer via the vertical vias, and tough restrictions on channels are imposed to maintain relative positional relationships to neighboring pads.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a multilayer wiring substrate capable of greatly relaxing the channel problem about the high-density multi-I/O rerouting in excess of thousands or more. Further, it is another aspect of the present invention to provide a multilayer wiring substrate capable of exhibiting excellent electrical characteristics typified by low impedance, good impedance matching, low crosstalk, etc. and solving the problem of heat radiation. Still further, it is still another aspect of the present invention to provide a method of manufacturing the multilayer wiring substrate by simplified and shortened processes with high reliability and yield, and a semiconductor device using the multilayer wiring substrate.

According to one or more aspects of the present invention, there is provided a multilayer wiring substrate on which at least one semiconductor element is mounted. The multilayer wiring substrate comprises: a baseboard; a first wiring layer formed on the baseboard and having a plurality of first wiring portions; an insulating layer formed on the baseboard; a second wiring layer formed on the insulating layer and having a plurality of second wiring portions, the second wiring portions being electrically connected to each other via a conductor wire, the conductor wire being arranged within the insulating layer three-dimensionally in a curved manner; and conductor portions configured to pass through the insulating layer and connecting the first wiring portions and the second wiring portions.

According to one or more aspects of the present invention, there is provided a method of manufacturing a multilayer wiring substrate. The method comprises: (a) preparing a metallic foil; (b) providing conductor wires on the metallic foil three-dimensionally in a curved manner; (c) coating fluid organic insulating material on the metallic foil such that the metallic foil and the conductor wires are entirely covered with the fluid organic insulating material; (d) forming an organic insulating material layer in a semi-cured state by curing the organic insulating material in partway; (e) aligning the organic insulating material layer with a baseboard having wiring portions thereon; (f) mounting the organic insulating material layer on the baseboard such that the organic insulating material layer contacts the wiring portions of the baseboard; (g) forming openings in portions of the metallic foil corresponding to the wiring portions of the baseboard; (h) selectively etching the organic insulating material layer exposed from the metallic foil through the openings, while using the metallic foil as a mask, thereby forming through holes in the organic insulating material layer; (i) filling a conductor material in the through holes, thereby forming conductor portions which connect the metallic foil and the wiring portions of the baseboard; and (j) patterning the metallic foil to form wiring portions.

According to one or more aspects of the present invention, there is provided a semiconductor device. The semiconductor device comprises: a multilayer wiring substrate comprising: a baseboard; a first wiring layer formed on the baseboard and having a plurality of first wiring portions; an insulating layer formed on the baseboard; a second wiring layer formed on the insulating layer and having a plurality of second wiring portions, the wiring portions being electrically connected to each other via a conductor wire, the conductor wire being arranged within the insulating layer three-dimensionally in a curved manner; and conductor portions configured to pass through the insulating layer and connecting the first wiring portions and the second wiring portions, and at least one semiconductor element mounted on multilayer wiring substrate.

Other aspects and advantages of the present invention will be apparent from the following description, the drawings, and the claims.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF EXEMPLARY EMBODIMENTS OF THE PRESENT INVENTION

Figure 1:
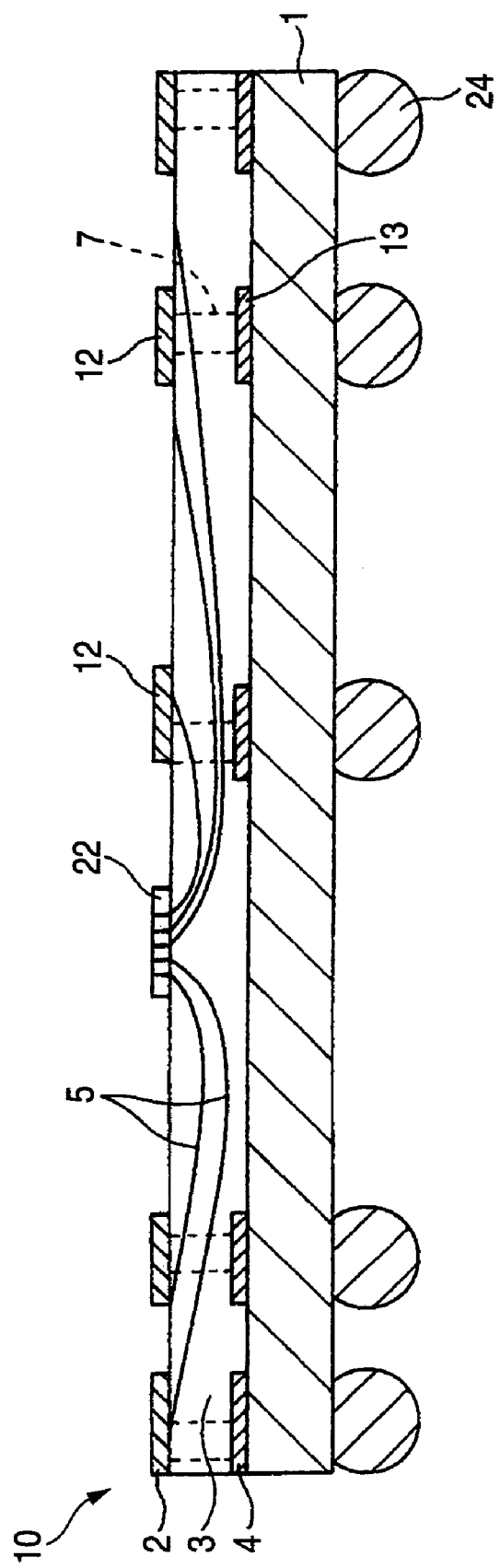
FIG. 1 is a sectional view showing a multilayer wiring substrate according to an exemplary embodiment of the present invention.

A multilayer wiring substrate, a method of manufacturing the same, and a semiconductor device according to the present invention can be carried out in various preferred modes respectively. Exemplary embodiments of the present invention will be described with reference to the accompanying drawings hereinafter. Also, the present invention is not limited to exemplary embodiments described hereinafter.

An aspect of the present invention resides in a multilayer wiring substrate. The multilayer wiring substrate according to the present invention can have a configuration shown in FIG. 1, for example. A multilayer wiring substrate 10 includes a baseboard 1 on an upper surface of which wiring layers 4 are provided, and an insulating layer 3 laminated on the baseboard 1. Wiring layers 2 are formed on a surface of the insulating layer 3. The wiring layers 2 are formed by patterning a metallic foil, and have connection terminals 22 on which a semiconductor element is mounted, and wiring portions 12 that function as external connection terminals. The semiconductor element connection terminals 22 are illustrated such that they come into contact with each other, but actually these connection terminals are separated individually. The semiconductor element mounted on the connection terminals 22 is not particularly limited, and thus various semiconductor chips (e.g., IC chip, LSI chip) may be used. Also, in mounting such semiconductor chip, the ordinary technique, e.g., flip-chip mounting, chip mounting, etc. can be used. One or plural semiconductor element may be mounted. Also, when a plurality of semiconductor elements are mounted, same semiconductor elements may be mounted or different semiconductor elements may be mounted. Also, bumps 24 (e.g., solder bumps) are provided on the opposite side surface of the baseboard 1 to the semiconductor element mounting surface. According to the present invention, since the semiconductor element is connected to the opposite side surface to the surface that is connected to the motherboard, etc., the heat radiation system such as a heat spreader, or the like can be provided.

As described above, the wiring portions 12 and the connection terminals 22 are formed on the wiring layers 2 that are formed by selectively etching the metallic foil. The metallic foil used for forming the wiring layers 2 is not particularly limited, but nickel foil, cobalt foil and copper foil may be used. In this embodiment, it is advantageous that the copper foil should be used.

The wiring layers 2 may be used as they are. In the present invention, normally the wiring layers are used in a state that the external connection terminals (connection pads) called the wiring portions 12 and the semiconductor element connection terminals 22 are formed thereon. The connection pads may be formed in the form of a single layer, or may be formed in the form of composite pads each having a multilayer structure that consists of two layers or more. The composite pads can be formed, for example, when a first pad is formed by plating a low-melting metal and a second pad is formed subsequently by plating a metal that has a melting point higher than the low-melting metal. The low-melting metal is preferably used in the form of alloy. As the adequate low-melting metal, there are tin-lead (SnPb) alloy, tin-silver (SnAg) alloy, tin-copper-silver (SnCuAg) alloy, etc., for example. Also, it is advantageous that, when the composite pad type terminals are formed as described above, the formation of the first pads should be executed under such a condition that a resultant area of the first pad is larger than an area of the second pad respectively. To explain generally a size of such external connection terminals, for example, in the case of circle, a diameter is about 100 to 200 μm and a thickness is about 5 to 30 μm. Also, in order to enhance reliability of connection, and the like, these external connection terminal may have solder bump, land, or other means on their surfaces, which is commonly applied in the field of the wiring substrate, as occasion demands.

Normally the wiring layers 2 can be formed favorably by the selective etching of the metallic foil. Since the multilayer wiring substrate can be formed by various approaches in accordance with the present invention, the wiring layers 2 may be formed by another approach, depending on steps of forming the multilayer wiring substrate. For example, the wiring layers 2 may be formed by the electroplating of a conductive metal instead of the etching of the metallic foil. For example, the wiring layers 2 can be formed when a conductive metal such as palladium, cobalt, nickel, or the like, for example, is formed up to a predetermined film thickness by the electroplating, while masking the area except the wiring layer forming area by a resist.

Figure 3:
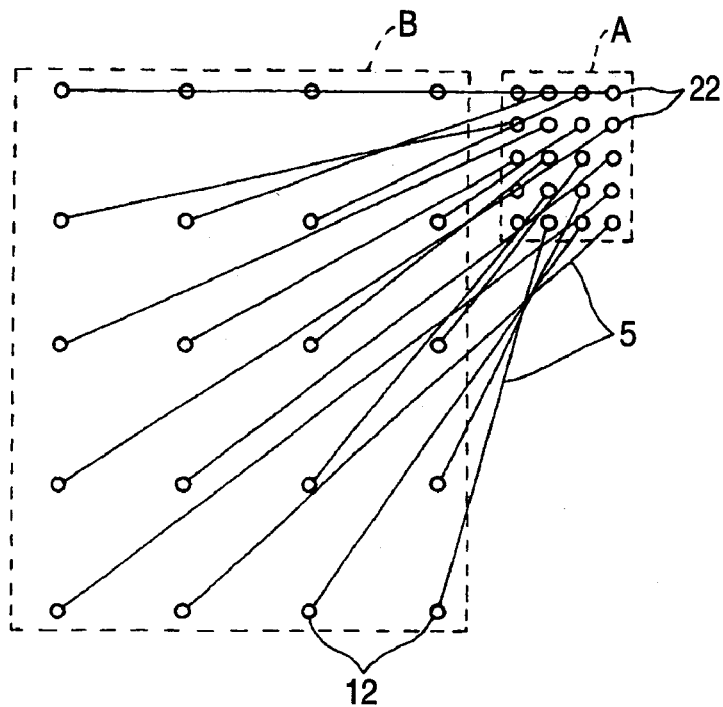
FIG. 3 is a schematic view to describe a reason why a reduction in impedance due to a reduction in a wiring length can be implemented in the multilayer wiring substrate according to an exemplary embodiment of the present invention.
Figure 4:
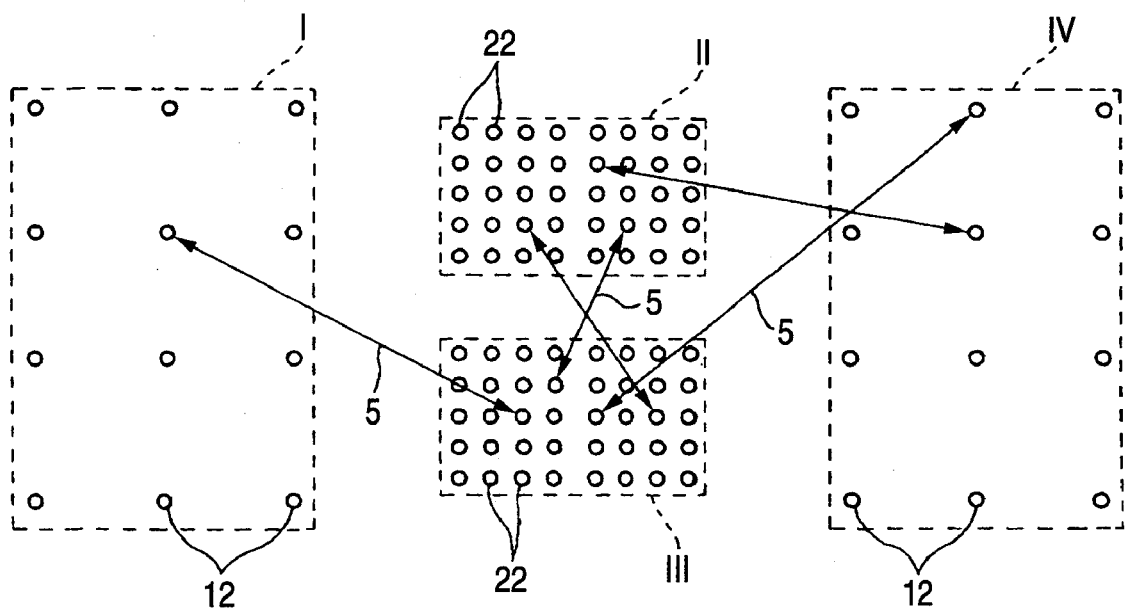
FIG. 4 is a schematic view to describe another reason why a reduction in impedance due to a reduction in a wiring length can be implemented in the multilayer wiring substrate according to exemplary embodiment of the present invention.

The wiring portions 12 and the connection terminals 22 can be arranged on the insulating layer 3 in various patterns, preferably in the area array pattern, respectively. FIG. 3 and FIG. 4 show an example in which the wiring portions 12 and the connection terminals 22 are arranged in an area array fashion, respectively. In the case of an example of arrangement in FIG. 3, an area A is a gathering of the semiconductor chip connection terminals 22, and the wiring portions (external connection terminals) 12 are gathered in a neighboring area B. Also, in the case of an example of arrangement in FIG. 4, areas II and III are a gathering of the semiconductor chip connection terminals 22 respectively, and the wiring portions (external connection terminals) 12 are gathered in neighboring areas I and IV. As understood from these examples of arrangement, in the case of the multilayer wiring substrate of the present invention, respective wiring patterns are extended linearly or substantially linearly when the wiring patterns of conductor wires 5 are viewed from the top. As described above, a lower inductance can be attained by reducing a wiring length up to a shortest length in this manner.

The insulating layer 3 of the multilayer wiring substrate 10 can be formed of any insulating material. Preferably the insulating layer 3 should be formed of the organic insulating material by the approach such as coating, potting, or the like. As the adequate organic insulating material, epoxy resin, polyimide resin may be used. It is essential that the conductor wire should be embedded in the insulating layer of the present invention. Conveniently enough, such wire-embedded structure can be formed not by special steps, which are provided separately from manufacture of the multilayer wiring substrate, but in any stage in the course of manufacture of the multilayer wiring substrate.

The organic insulating material used in forming the insulating layer may be used as it is. In order to improve the heat radiation performance, the organic insulating material may be used in the form of the particle dispersion type organic insulating material in which particles of the highly thermal conductive material are dispersed. It is advantageous that the particle dispersion type organic insulating material should be formed of a binder resin made of the above organic insulating material, and fillers such as particles, powders, made of the highly thermal conductive material that is dispersed in the binder resin. As the adequate filler, gold, silver, copper, nickel, and their alloy may be used, for example. Also, a shape and a size of the filler can be changed arbitrarily, but preferably a spherical shape should be employed.

In the multilayer wiring substrate 10 of the present invention, a plurality of wiring portions formed in the wiring layer are electrically connected by conductive wires. For example, by reference to FIG. 1, the semiconductor chip connection terminal 22 formed in the wiring layers 2 on the insulating layer 3 are electrically connected to the wiring portions 12 formed similarly on the wiring layers 2 via the conductor wires 5. As illustrated, the conductor wires 5 are curved and arranged three-dimensionally. However, since the conductor wires 5 are arranged inside the insulating layer 3, the connection terminal (wiring portions) 22 and 12 and the conductor wires 5 are not positioned on the coplanar surface. Also, the arranged patterns of the conductor wires 5 in the insulating layer 3 are not curved when viewed from the top of the multilayer wiring substrate 10. That is, as shown in FIG. 3 and FIG. 4, the wiring patterns connecting the wiring portions (connection pads) 22 and 12 are provided substantially linearly. As shown in FIG. 3 and FIG. 4, when the wiring portions are arranged in the area array fashion and flip-chip connected mutually, a plurality of wiring portions can be arranged in a matrix fashion and can be connected mutually. In this case, in FIG. 1, the conductor wires 5 are connected from the semiconductor element connection terminals 22 to the external connection terminals 12 respectively. But either the semiconductor element connection terminals 22 may be connected by the conductor wires 5 mutually or the external connection terminals 12 may be connected by the conductor wires 5 mutually, as the case may be.

In the implementation of the present invention, the wires that are used commonly as the bonding wire in the field of the semiconductor device can be favorably used as the conductor wire. However, since the bonding wire used in the present invention must be sealed in the insulating layer, such bonding wire that is able to withstand the sealing must be used. The conductor wire can be formed of any conductive material (conductor), preferably the conductor wire should be formed of a conductor metal. As the adequate conductor metal, gold, silver, copper, nickel, aluminum, and their alloy may be used, for example.

In the implementation of the present invention, it is advantageous that, in order to avoid occurrence of the crosstalk, a coaxial structure should be provided such that a surface of the conductor wire is covered with a metal layer via the insulating layer and the conductor wire acts as the core. More particularly, as shown in FIG. 6D as a sectional view taken along a line D-D in FIG. 6C, it is advantageous that the conductor wire should have the coaxial structure that consists of the conductor wire 5 and an insulating layer 14 and a metal layer 15 formed to cover sequentially the conductor wire 5. The core of the conductor wire having the coaxial structure can be favorably formed of the conductor metal such as gold, silver, copper, nickel, aluminum, their alloy, and the like, for example, as described above. Also, preferably the insulating layer for covering such conductor wire may be formed of the insulating resin coating (e.g., the coating of epoxy resin and polyimide resin). Also, in the case of the aluminum wire, an oxide coating is available. The resin coating can be formed by electrostatic coating, spray coating and dip coating, for example. In this case, the commercially available conductor wire on a surface of which the insulating coating has already been formed may be used instead of the coating of the insulating layer on the conductor wire. The uppermost metal layer can be formed of a conductor metal such as gold, silver, copper, nickel, aluminum, and their alloy, for example. In particular, the copper can be used favorably as the conductor metal. The copper layer can be formed favorably by the electroless copper plating or the electrolytic copper plating, for example. Preferably the metal layer is electrically connected to a ground potential.

The conductor wire can have the structure, the material, etc. of various sizes. For example, a diameter of the conductor wire or a diameter of the core of the conductor wire in the case of the coaxial structure is normally about 20 to 40 μm. Also, a thickness of the insulating layer for coating the core is normally about 2 to 8 μm when the conductor wire on the periphery of which the insulating layer is coated previously is used and the bonding wire is applied as it is. Also, a thickness of the insulating layer is normally about 10 to 50 μm when the bonding wire is applied by using the uncoated conductor wire and then the insulating layer is coated on the periphery of the conductor wire. A thickness of this insulating layer will be varied depending on the material used as the insulating layer and the request for the impedance matching. Here, in the multilayer wiring substrate 10 of the present invention, a capacitance can be given to the resultant multilayer wiring substrate when the material (relative dielectric constant) and the thickness of this insulating layer are adjusted in accordance with the conductive resin surrounding the conductor wire. Like the insulating layer, a film thickness of the metal layer being formed by coating the insulating layer can also be changed in a wide range in response to a desired effect, etc., if necessary, and is normally about 5 to 30 μm.

By reference to FIG. 6D, it is advantageous that, in the conductor wire having the coaxial structure, a ratio of an inner diameter D0 of the metal layer 15 to an outer diameter D1 of the conductor wire 5 should be set in a range of about 1:3 to 6. With this arrangement, not only the occurrence of crosstalk can be avoided but also the impedance matching can be effectively attained.

In the multilayer wiring substrate 10 of the present invention, the wiring portions (external connection terminals) 12 formed on the wiring layers 2 are electrically connected to the wiring layers 4 via conductor portions 7. The conductor portions 7 are formed to pass through the insulating layer 3 having the wiring layers 2 thereon. The wiring layers 4 are wiring portions 13 formed on the wiring layers 4 of the baseboard 1 of the multilayer wiring substrate 10.

The ordinary baseboard can be used in the multilayer wiring substrate 10, and the baseboard 1 is not particularly limited. The baseboard 1 may be formed of the inorganic insulating material such as ceramic material, plastic material, or the like, for example. The wirings, etc. are incorporated into the baseboard 1, although not shown, and also the wiring portions 13 are formed on the surface, as shown in FIG. 1. The wiring portions 13 are the electrodes, the wirings, the external connection terminals, etc. of the baseboard 1. Also, the wiring portion 13 has the similar structure to the wiring portion 12 already described, and can be formed by the similar approach. Also, although not shown, the external connection terminals are formed on the back surface of the baseboard 1, and also the solder bumps used for the connection to external components are mounted on the external connection terminals respectively. In FIG. 1, the bumps 24 are illustrated in a simplified mode.

In the multilayer wiring substrate 10 of the present invention, the conductor portions 7 formed to pass through the insulating layer 3 are used to connect the wiring portions 12 of the wiring layers 2 to the wiring portions 13 of the baseboard 1. In the implementation of the present invention, the conductor portion 7 can be formed in various processes. For example, the conductor portions 7 for connecting the wiring portion 12 and the wiring portion 13 respectively can be formed by forming through holes, which pass through the insulating layer 3, and filling a conductor metal in the through holes by the conductor plating. According to another approach, conductor metal posts, each of which has a shape and a dimension corresponding to those of the conductor portion 7, may be arranged in any stage applied to form the multilayer wiring substrate 10 instead of the formation of the conductor portion 7 by the conductor plating, and thus the conductor portions 7 can also be formed.

When the conductor portions are formed by the conductor plating, normally such conductor portions can be implemented by applying the conductor plating to the through holes that pass through the insulating layer. Concretely, for example, a resist is coated on a whole surface of the insulating layer, and then the resist is removed from the portions in which the conductor is formed respectively. Then, a conductor material used to form the conductor portion, e.g., palladium, cobalt, or nickel is formed up to a predetermined thickness by the electroplating to cover the resist and the underlying insulating layer. Then, the target conductor portions can be obtained by removing the resist used as a mask.

When the conductor portions are formed by the metal post, normally such conductor portions can be formed by arranging conductor wires on the metallic foil used to form the wiring layer, and then providing the pillars made of the conductor metal like the posts (so-called metal posts) in predetermined positions of the metallic foil. The metal post mentioned herein means a circular post, a squarer post, or the like, but a thick conductor wire may be employed, as the case may be. In this method, the formation of the metal posts can be executed according to various approaches. For example, the metal posts can be formed by embedding the metal post respectively, otherwise by filling or plating the conductor metal that is suitable for the formation of the metal post. In more detail, the formation of such metal posts can be carried out by using any method set forth in JP-A-8-78581, JP-A-9-331133, JP-A-9-331134, JP-A-10-41435, and the like.

Figure 6A:
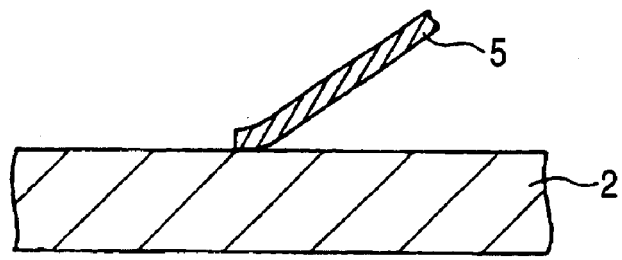
FIGS. 6A to 6D are sectional views showing a method of manufacturing a conductor wire having a coaxial structure usable in the multilayer wiring substrate according to an exemplary embedment of the present invention in due order.
Figure 6B:
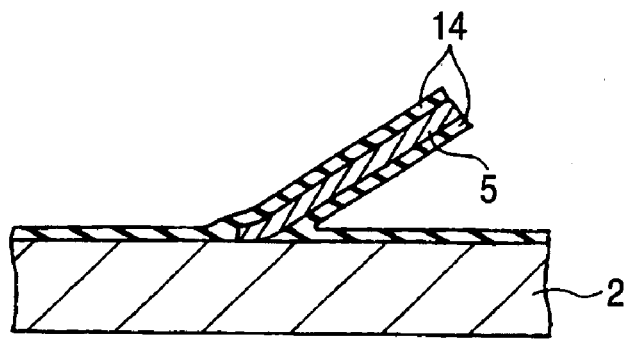
Figure 6C:
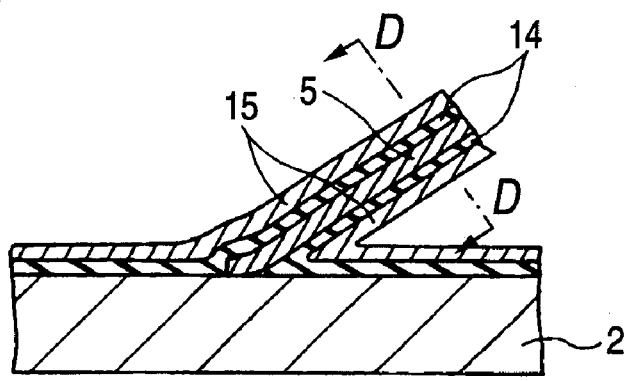
Figure 6D:
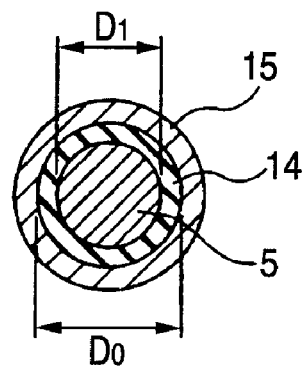
Figure 7:
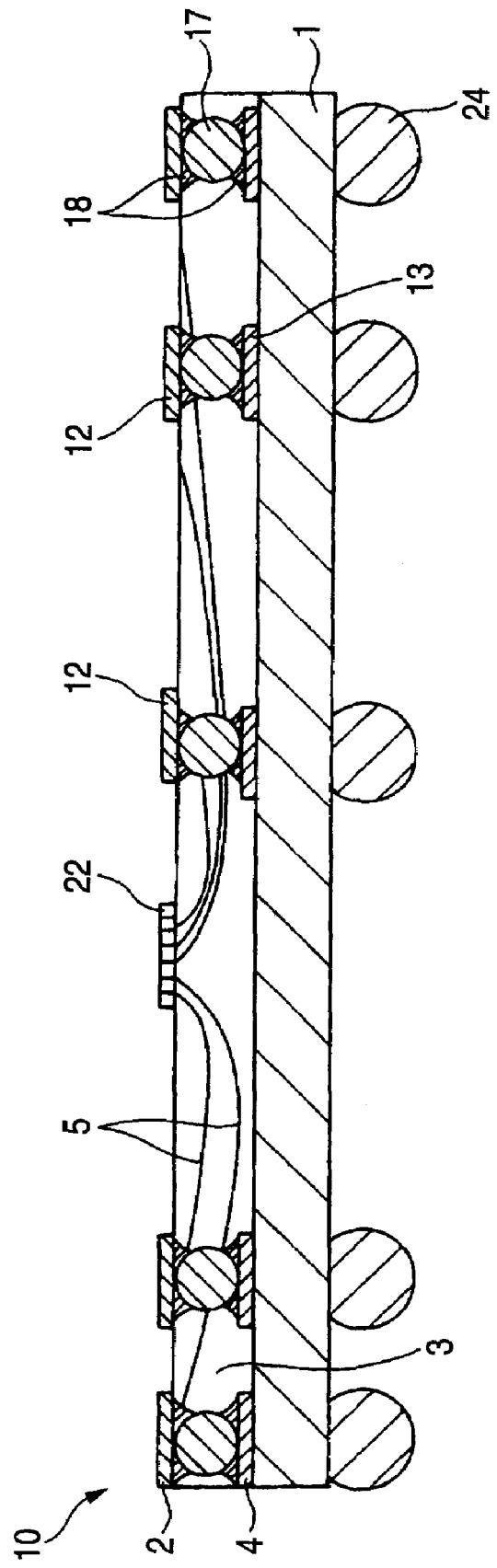
FIG. 7 is a sectional view showing a multilayer wiring substrate according to an exemplary embodiment of the present invention.
Figure 8:
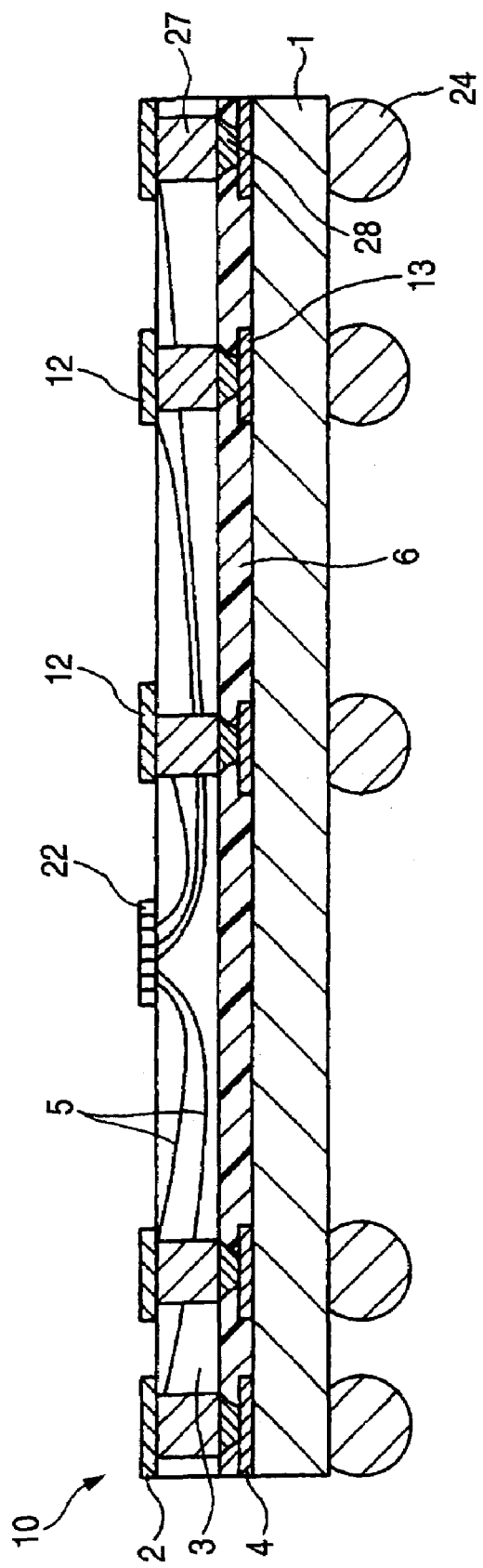
FIG. 8 is a sectional view showing a multilayer wiring substrate according to an exemplary embodiment of the present invention.

FIG. 7 and FIG. 8 are views to describe the multilayer wiring substrate according to another exemplary embodiment of the present invention. For example, the multilayer wiring substrate 10 shown in FIG. 7 can have a similar configuration to the multilayer wiring substrate 10 shown in FIG. 1 except a difference that the conductor portions 7 described by reference to FIGS. 6A to 6D are constructed by conductive metal cores (in this example, copper balls) 17 as illustrated. In the multilayer wiring substrate 10 as illustrated, the conductor portions can be formed by filling the copper ball in the through holes formed in the insulating layer respectively, and then fixing the copper balls with a solder, for example. With such arrangement, various advantages such as self-aligning of connection positions (the balls move in appropriate positions due to wettability of the solder), stress relaxation, omission of the plating step, etc., for example, can be obtained.

Also, the multilayer wiring substrate 10 shown in FIG. 8 shows a mode in which another insulating layer 6 is provided further between the insulating layer 3 and the wiring layers 4 of the baseboard 1. In this example, the conductor portions are formed by a metal post 27 respectively. As described above, the metal posts 27 can be connected to the wiring portions 13 on the motherboard 1 via connection pads 28 made of a low-melting metal. In the multilayer wiring substrate 10, another insulating layer 6 can be formed preferably of an adhesive agent, or more preferably an insulating adhesive agent (e.g., a polyimide-based adhesive agent, or the like). By employing such structure, various advantages (e.g., cure (hardening) of the adhesive agent and connection between the conductors can be conducted simultaneously, the plating step can be omitted) can be attained. In this case, the metal posts 27 are used in FIG. 8 as they are, but other connecting means may be used instead of them. For example, the balls are fabricated by the wire made of metal such as gold, or the like, and then the ball-like metal posts can be formed by removing a part of the balls respectively.

Figure 9:
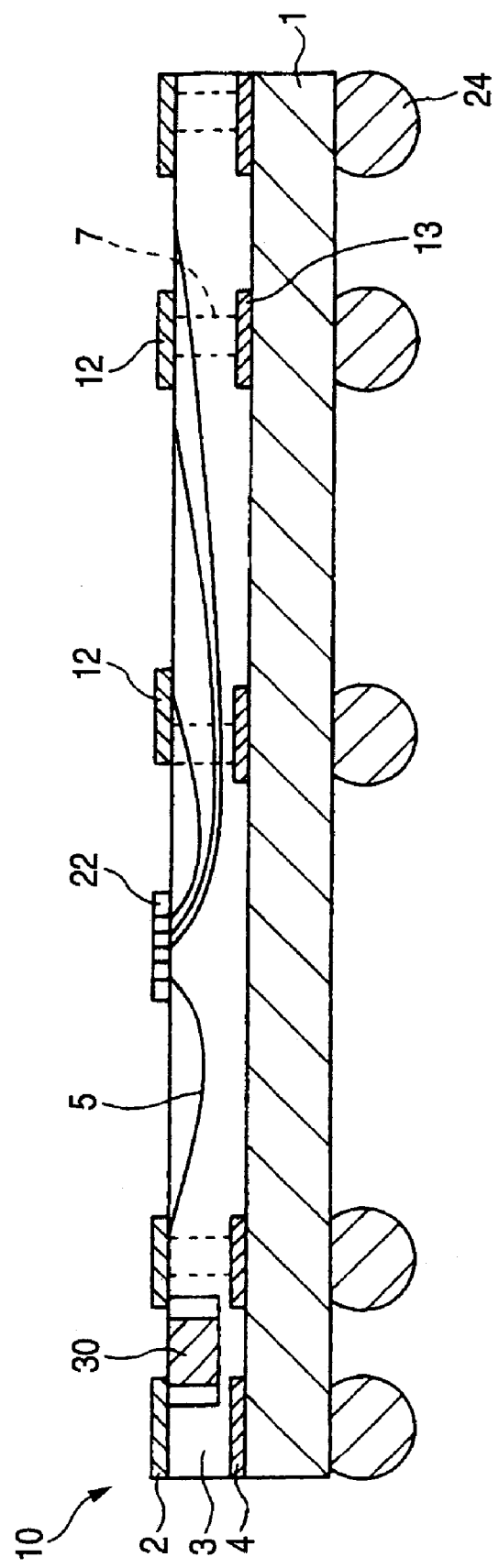
FIG. 9 is a sectional view showing a multilayer wiring substrate according to an exemplary embodiment of the present invention.
Figure 10:
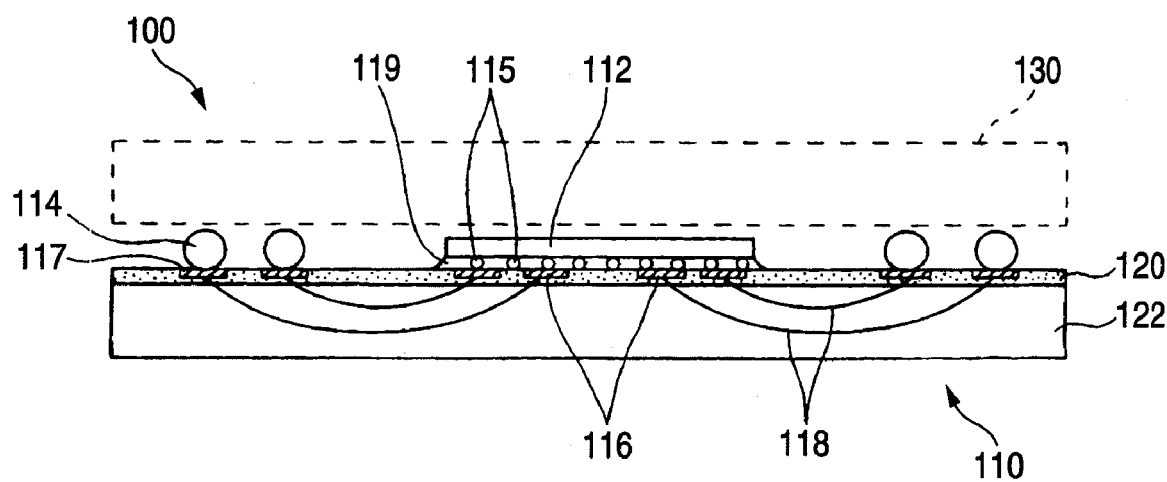
FIG. 10 is a sectional view showing a semiconductor device in the related art.

The multilayer wiring substrate of the present invention may be equipped further with a chip component, and the like. For example, as shown in FIG. 9, the multilayer wiring substrate 10 can have further a chip component 30, which is connected electrically to the wiring portions 12 of the wiring layers 2, in the insulating layer 3. The chip component 30 may be composed of capacitor, resister, inductor, or the like, but this chip component is not limited to these components. Also, other functional component may be embedded instead of these components. Also, when the chip component 30 is embedded in the concave portion (cavity) formed in the insulating layers 3, miniaturization and compactification of the resultant multilayer wiring substrate 10 can be attained. In this case, the chip component 30 in the concave portion may be sealed with a resin by filling an insulating resin such as a resist, for example, in the concave portion by means of the potting.

Figure 5A:
FIGS. 5A to 5F are sectional views showing a method of manufacturing the multilayer wiring substrate shown in FIG. 1 in due order.

FIGS. 5A to 5F show a method of manufacturing the multilayer wiring substrate according to the present invention in due order. At first, as shown in FIG. 5A, the metallic foil 2 used to form the wiring layers is prepared. As described above, the metallic foil 2 can be formed of a copper foil or other conductor metal. It is advantageous that alignment marks should be put previously on the metallic foil 2 to execute an aligning operation in later stage precisely and quickly.

Figure 5B:
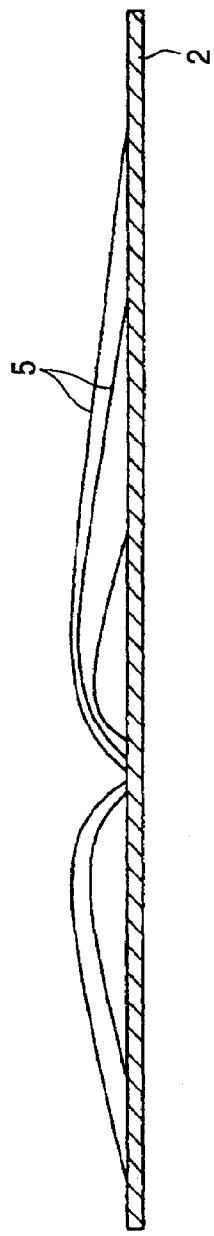

Then, as shown in FIG. 5B, the wire bonding is applied. In the wire bonding operation, the conductor wires such as gold wires, for example, are arranged on portions, in which the wiring portions of the wiring layers are formed in a later step, of the metallic foil 2 and then the wiring portion forming portions are connected electrically mutually. As the connecting means, the common wire bonding technology can be used. The conductor wire can have a diameter of 20 μm, for example. It is advantageous that the conductor wire can be used in the form of the conductor wire having a coaxial structure.

When the conductor wire is used in the form of the conductor wire having a coaxial structure, preferably the conductor wire can be formed as shown in FIGS. 6A to 6D. At first, as shown in FIG. 6A, one end of the conductor wire 5 is connected to the metallic foil 2. Then, as shown in FIG. 6B, the insulating layer 14 is formed by coating a surface of the connected conductor wire 5 and an area, to which the conductor wire 5 and the wiring portion forming portion are connected, with the insulating material. Then, as shown in FIG. 6C, the metal layer 15 is formed by coating the insulating layer 14 with the metal material. The metal layer 15 is formed by the electroless plating or the metallic compound thermal decomposition method, for example. Also, it is advantageous that the metal layer 15 should be connected electrically to a ground potential. In this manner, as shown in FIG. 6D, i.e., as shown in a sectional view taken along a line D-D in FIG. 6C, the conductor wire having the coaxial structure in which the conductor wire 5 is used as the core can be formed.

It is common in order that, after the wire bonding is completed, the resultant conductor wire is coated with the fluid organic insulating material. However, in the implementation of the present invention, other steps may be executed in advance in response to the manufacturing process. For example, when the metal posts acting as the conductor portions are used instead of the conductor portions formed by the plating, the metal posts may be provided upright on the metallic foil subsequently to the wire bonding step.

Figure 5C:
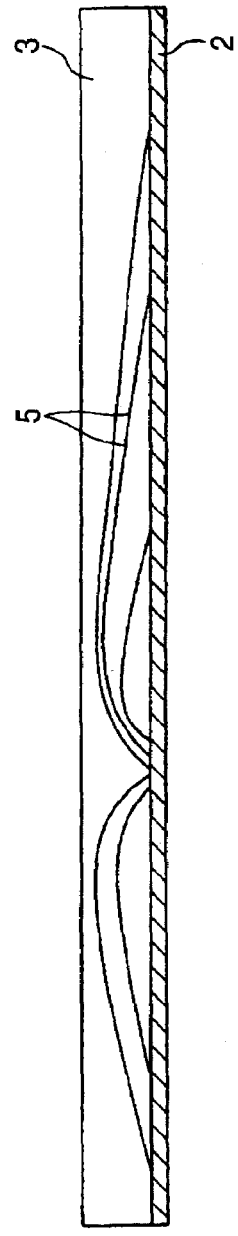

Subsequently, as shown in FIG. 5C, the fluid organic insulating material is coated on the metallic foil 2 at a thickness that is enough to cover entirely the metallic foil 2 and the conductor wires 5, and is cured. As the organic insulating material, for example, a three-fluid epoxy resin is coated by the potting, and then cured by keeping a temperature of 5020 C. to 100° C., for example. The resultant resin layer after this is still in a semi-cured state.

Figure 5D:
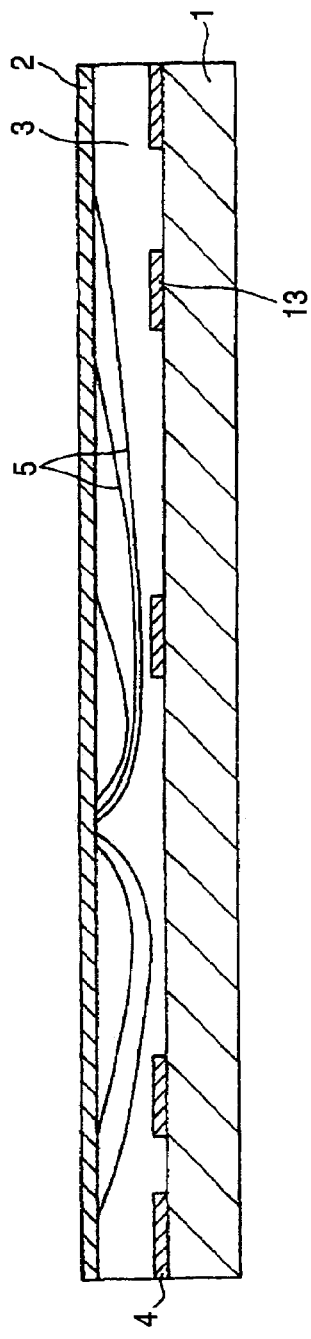

While the organic insulating material is still in a semi-cured state, the insulating layer 3 of the organic insulating material is turned downward and the wiring layer 2 is directed upward, as shown in FIG. 5D. Then, the insulating layer 3 is aligned with the baseboard 1 of the multilayer wiring substrate being prepared separately, and is stacked on the baseboard 1. The wiring portions (patterned wiring layers) 13 are already formed on the surface of the baseboard 1. As the result of this stacking, the insulating layer 3 of the organic insulating material that has the metallic foil 2 and is kept in a semi-cured state can be faced to the wiring layer holding surface of the baseboard 1.

Figure 5E:
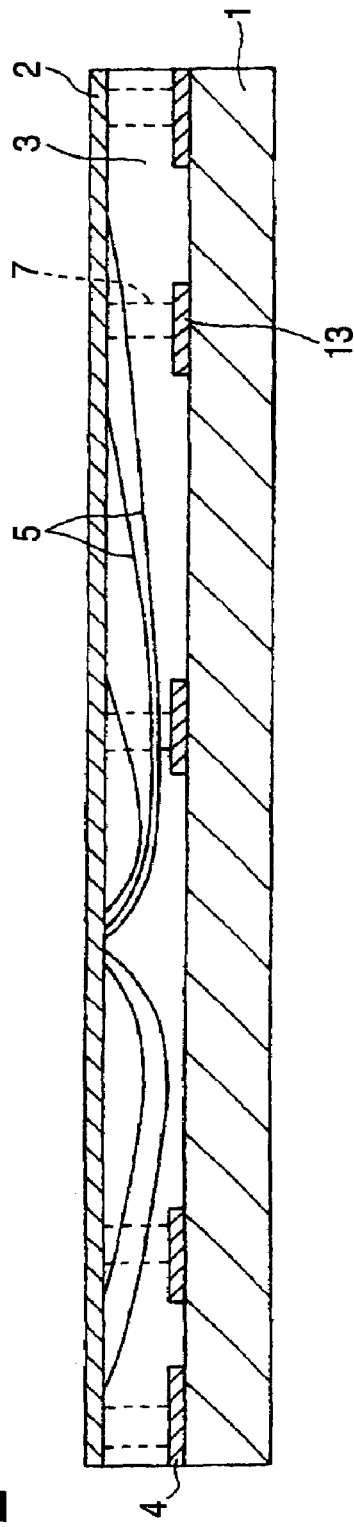

After the insulating layer 3 of the organic insulating material is stacked on the baseboard 1, opening portions are formed in the portions of the metallic foil 2 in the resultant stacked body, which correspond to the wiring portions 13 on the wiring layer mounting surface of the baseboard 1 (portions, which correspond to the metallic foil 2, of dotted portions indicated by the reference numeral 7 in FIG. 5E). For example, an etching resist layer is formed on the metallic foil 2, and then the portions, which correspond to the wiring portions 13 on the baseboard 1, of the metallic foil 2 are removed selectively by the etching, so that the opening portions can be easily formed. After the formation of the opening portions, the insulating layer 3 formed of the organic insulating material and exposed from the opening portions is selectively etched while using the etching resist layer as a mask. When the etching is stopped at the wiring portions 13 on the baseboard 1, the through holes reaching the wiring portions 13 on the baseboard 1 from the metallic foil 2 can be formed.

As shown in FIG. 5E, after the formation of the through holes, the conductor portions 7 for connecting the metallic foil 2 and the wiring portions 13 on the baseboard 1 are formed by filling the conductor metal in the through holes by the plating. The formation of the conductor portions 7 can be implemented by applying the electroless copper plating and the electrolytic copper plating sequentially to the overall surface of the metallic foil 2, for example, based on the plating of the conductor metal. The conductor metal can be filled in the through holes and overlying opening portions in the metallic foil 2 by such plating of the conductor metal. After the plating is completed, the etching resist layer remaining on the uppermost layer is removed.

Figure 5F:
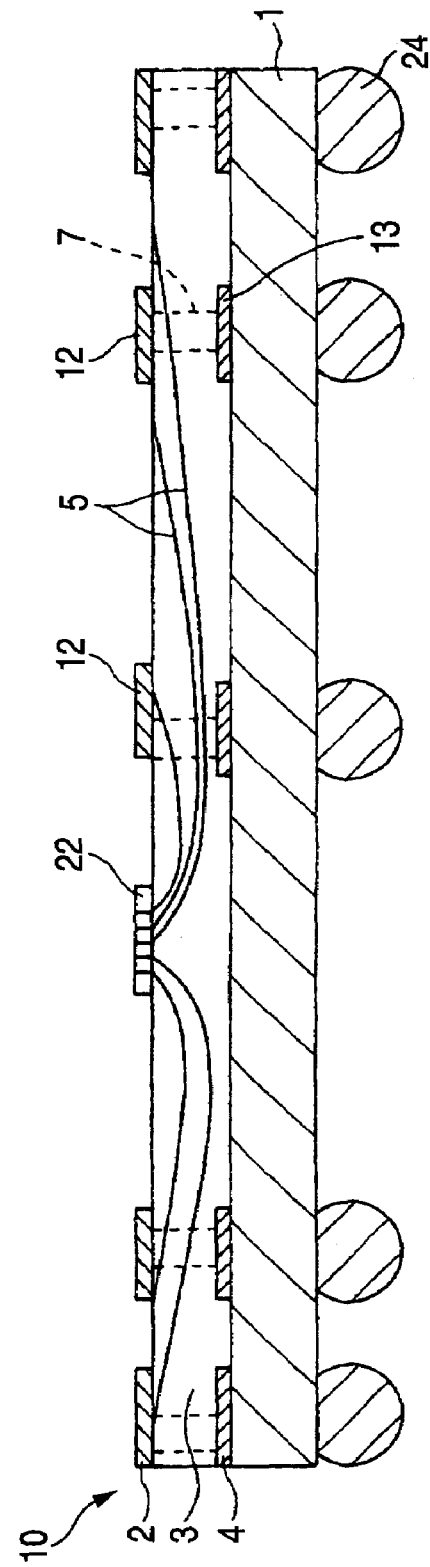

Finally, as shown in FIG. 5F, the wiring layers 2 are formed by selectively patterning the metallic foil 2 in accordance with the desired wiring patterns, and the semiconductor chip connection terminals 22 and the external connection terminals 12 are formed thereon. The bumps 24 are formed on the lower surface of the baseboard 1. When the solder resist layer (not shown) is formed on the outermost surface, the multilayer wiring substrate 10 shown in FIG. 1 and described previously can be completed.

The method of manufacturing the multilayer wiring substrate described above can be varied variously within scope of the present invention, as described above. For example, the three-fluid epoxy resin may be formed and cured after the completion of the wire bonding step, and then the through holes may be formed in the predetermined portions. After the formation of the through holes, the conductor metal such as copper, for example, may be filled in the through holes by the plating, and subsequently the baseboard having the wiring portions may be aligned with the resultant structure and stacked thereon.

Also, in the method of manufacturing the multilayer wiring substrate, a step of forming another insulating layer after the layer formed of the organic insulating material in a semi-cured state is completely cured may be further provided between the step of forming the layer of the organic insulating material in a semi-cured state and the step of forming the metallic foil on the baseboard of the multilayer wiring substrate. In the case of this method, preferably another insulating layer should be formed of an adhesive agent layer. With such a configuration, there is another advantage in that the insulating material can be handled as the stable intermediate material by curing the layer that contains a wire in its inside, for example.

Further, a step of connecting the chip component or other component to the metallic foil may be further provided before or after the step of connecting electrically the wiring portion forming portions mutually via the conductor wire. In this method, a marking area of the insulating material may be formed in the periphery of the connection portion in advance before the chip component or other component is connected.

According to another aspect of the present invention, the present invention provides a semiconductor device having the multilayer wiring substrate. The semiconductor device of the present invention includes the multilayer wiring substrate having two wiring layers or more in its inside, and at least one semiconductor element mounted in a predetermined position of the multilayer wiring substrate. In this semiconductor device, the multilayer wiring substrate corresponds to the multilayer wiring substrate of the present invention described previously. Also, in the semiconductor device, the insulating layers having the wiring layers may further includes a chip component connected electrically to the wiring portions of the wiring layers in its inside.

Figure 2:
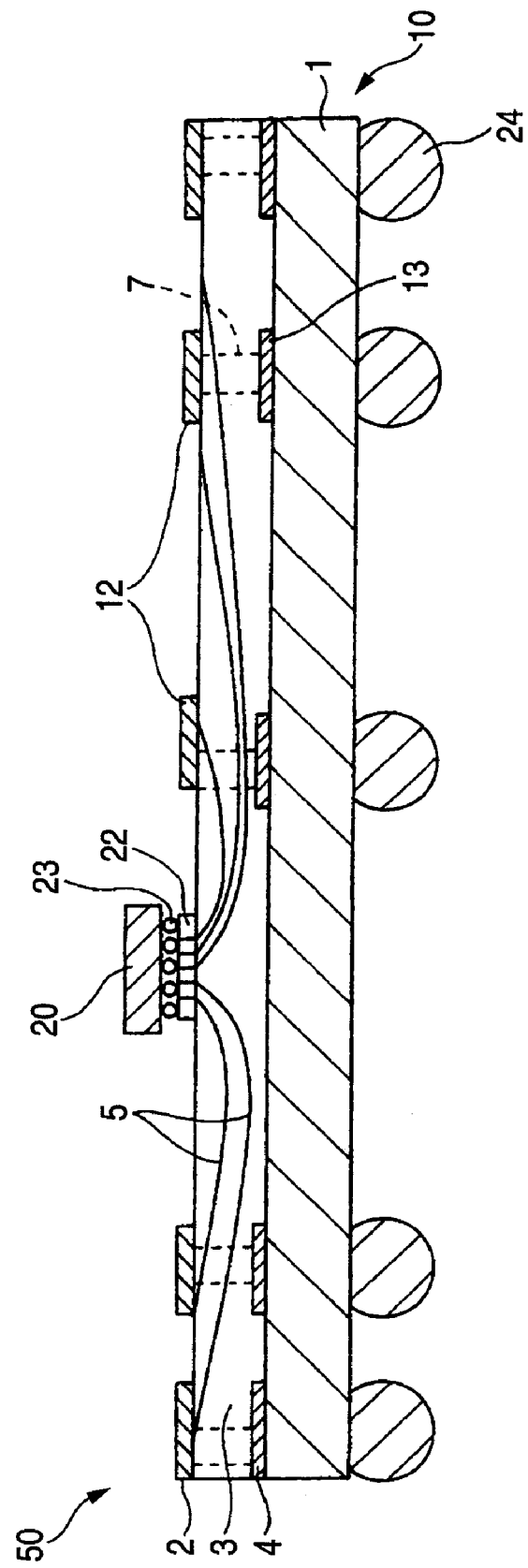
FIG. 2 is a sectional view showing a semiconductor device according to an exemplary embodiment of the present invention.

FIG. 2 is a sectional view showing a semiconductor device according to an exemplary embodiment of the present invention. A semiconductor device 50 illustrated shows an example in which a semiconductor chip 20 is mounted on the multilayer wiring substrate 10 shown in FIG. 1. The semiconductor chip 20 is connected electrically to the multilayer wiring substrate 10 via bumps 23 formed on the semiconductor chip connection terminals 22. The external connection terminals 12 are provided on the coplanar surface to the semiconductor mounting surface, and an external device can be connected to these external connection terminals 12. In this case, it is advantageous that the semiconductor chip should be a semiconductor element whose heat generation is small, and also it is advantageous that the mounted external device should have a mechanism for radiating heat. In the insulating layer 3, metallic powders (fillers) are scattered into the insulating resin to enhance a thermal conductivity. Also, portions of the bumps 23 of the semiconductor chip 20 may be sealed with the underfill material. Also, the bumps 24 are provided on the baseboard 1. The bumps 24 are made of a solder bump (SnAg) respectively, for example.

In the semiconductor device 50, in the electrical connection between the semiconductor chip connection terminals 22 and the external connection terminals 12 via the conductor wire 5, the conductor wire 5 may have the coaxial structure, as described with reference to FIGS. A to 6D. Also, although not shown, the uppermost metal layer of the conductor wire 5 may be connected to a ground potential.

According to the present invention, the channel problem about the high-density multi-I/O rerouting in excess of thousands or more, which still remains as the problem in the multilayer wiring substrate, can be solved simultaneously with the problem of heat radiation. Also, the excellent electrical characteristics typified by low impedance, good impedance matching or low crosstalk can be realized at the same time.

Concretely, in the conventional approach, the leading of the pad in the high-density wiring pattern depends on the wirings between the pads. According to this approach, a wiring length becomes long and thus it was impossible to avoid an increase of impedance. In contrast, in the present invention, the pad leading wiring is provided by the conductor wire, and also the conductor wires are arranged in a curved manner three-dimensionally respectively. Therefore, the wiring patterns of the conductor wires can be constructed substantially linearly respectively when viewed from the top. As a result, the wiring lengths can be shortened and thus a reduction of impedance can be attained.

Also, in the conventional approach, the inside pad portions that are not rerouted by the uppermost layer in the pad array used for the high-density mutual connection are connected to the underlying wiring layer via the vertical vias whereas the pad portions that are not rerouted there by the wiring layer are connected to the further underlying wiring layer via the vertical vias, and respective layers must be stacked until all pads are rerouted. In contrast, in the present invention, the vertical via connection can be eliminated by providing the wiring between the pads by using the conductor wire. As a result, discontinuity points of the impedance can be reduced and a reflection and an insertion loss can be reduced. Also, the connection via a large number of portions and the uncertain connection are not needed. Therefore, reliability of the connection can be greatly improved and yield can be enhanced.

Also, according to the wiring substrate of the present invention, such a configuration is not employed that the semiconductor element is provided between the wiring substrate and the motherboard. The motherboard can be connected to the surface of the wiring substrate opposing to the semiconductor element mounting surface. Therefore, the heat radiating member such as the existing heat spreader can be provided to the semiconductor element.

Also, when the conductor wire is constructed by using the coaxial structure instead of a single wire of the conductor metal, either occurrence of the crosstalk can be avoided or the crosstalk can be suppressed lower. Also, since the conductor wire having a coaxial structure is covered entirely with a conductor, the low electromagnetic interference (EMI) can be implemented.

Also, as the organic insulating material used to seal the conductor wires in the multilayer wiring substrate, the insulating material may be used which is excellent in the thermal conductivity or the particle dispersion type insulating material may be used in which particles that are excellent in the thermal conductivity are dispersed. Therefore, heat radiation property of the semiconductor device can be improved.

As other advantages, low reflection and low insertion loss derived from the impedance matching can be attained by controlling a film thickness of the insulating layer, changing a relative dielectric constant of the insulating material used as the insulating layer, or the like when the surface of the conductor wire is coated with the insulating layer, for example. Also, since the wiring surface is smooth, a reduction of loss at the high frequency can be attained. Also, a low conductor loss can be attained by increasing a wiring sectional area in contrast to a wiring density (by changing the wire from the wiring having a rectangular section to the conductor wire having a circular section). Also, since the structure is simple, the multilayer wiring substrate or the semiconductor device can be manufactured by the simplified approach in a short time at a low cost, and also can respond flexibly to such change even when a design of the device is changed. Also, the semiconductor device is not built into the multilayer wiring substrate, but the connection terminals or the external connection terminals of the semiconductor device are exposed. Therefore, the semiconductor device can meet the demand for the manufacturer of the semiconductor device.

EXAMPLE

Subsequently, the present invention will be described with reference to an example. In this event, the present invention is never limited to the following example.

A copper foil on which alignment marks are formed (size: about 15 cm square) was prepared. Two spots on the pad surface of this copper foil were connected via a gold wire of 20 μm diameter in plural predetermined locations respectively. Then, the three-fluid epoxy resin was supplied by the potting to cover the copper foil and the gold wires entirely, and thus a resin layer that can cover the gold wires completely (thickness: about 30 μm on the copper foil) was formed. The resin layer was cured while holding at a temperature of 50 to 100° C. Then, the through holes each having an about 80 μm diameter were formed in predetermined positions by the $CO_2$ laser. In turn, a copper is filled in the through holes by applying the electroless copper plating or the electrolytic copper plating to the whole surface of the resin layer. After the completion of the plating, the resin layer with the copper foil could be obtained.

A baseboard having wiring patterns on its surface (prototype; size: about 20 cm square, thickness: about 260 μm) was prepared separately. The resin layer with the copper foil fabricated in preceding steps is aligned and connected to this baseboard while the copper foil is directed upward, and was bonded to the baseboard via a bonding sheet. Then, an etching resist was coated on the copper foil portion, and then the copper foil was etched into predetermined wiring patterns. After the completion of the etching, the multilayer wiring substrate was completed by coating a solder resist of about 20 μm thickness on the outermost surface.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A multilayer wiring substrate on which at least one semiconductor element is mounted, the multilayer wiring substrate comprising:
    a baseboard;
    a first wiring layer formed on the baseboard and having a plurality of first wiring portions;
    an insulating layer formed on the baseboard;
    a second wiring layer formed on the insulating layer and having a plurality of second wiring portions, the second wiring portions being electrically connected to each other via a conductor wire, the conductor wire being arranged within the insulating layer three-dimensionally in a curved manner; and
    conductor portions configured to pass through the insulating layer and connecting the first wiring portions and the second wiring portions.

2. The multilayer wiring substrate according to claim 1, further comprising:
    another insulating layer provided between the insulating layer and the baseboard.

3. The multilayer wiring substrate according to claim 1, wherein the conductor wire has a coaxial structure that the conductor wire is used as a core and a surface of the conductor wire is covered with a metal layer via the insulating layer.

4. The multilayer wiring substrate according to claim 1, further comprising:
    a chip component provided in the insulating layer and electrically connected to the second wiring portions.

5. The multilayer wiring substrate according to claim 4, wherein the chip component is a capacitor, a resistor, or an inductor.

6. A semiconductor device, comprising:
    a multilayer wiring substrate comprising:
        a baseboard;
        a first wiring layer formed on the baseboard and having a plurality of first wiring portions;
        an insulating layer formed on the baseboard;
        a second wiring layer formed on the insulating layer and having a plurality of second wiring portions, the wiring portions being electrically connected to each other via a conductor wire, the conductor wire being arranged within the insulating layer three-dimensionally in a curved manner; and
        conductor portions configured to pass through the insulating layer and connecting the first wiring portions and the second wiring portions, and at least one semiconductor element mounted on multilayer wiring substrate.

7. The semiconductor device according to claim 6, wherein the multilayer wiring substrate further includes:
    a chip component provided in the insulating layer and electrically connected to the second wiring portions.

* * * * *